(12) United States Patent
Lang et al.

(10) Patent No.: US 7,424,407 B2
(45) Date of Patent: Sep. 9, 2008

(54) REMOVING ELECTRICAL NOISE IN SYSTEMS WITH ADCS

(75) Inventors: Christoph Lang, Los Altos, CA (US); Fernando Gomez Pancorbo, Stanford, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/475,607

(22) Filed: Jun. 26, 2006

(65) Prior Publication Data

US 2007/0299635 A1     Dec. 27, 2007

(51) Int. Cl.
*G06F 17/10* (2006.01)
(52) U.S. Cl. .................... 702/191; 702/179; 708/322
(58) Field of Classification Search ............. 702/69, 702/70, 73, 74, 179, 180, 189–191, 194–196; 324/613, 614; 375/227, 346, 349, 350; 455/501, 455/63.1, 296; 708/322
See application file for complete search history.

(56) References Cited

U.S. PATENT DOCUMENTS 5,590,104 A * 12/1996 Britton ...................... 365/45
5,632,272 A * 5/1997 Diab et al. .................. 600/323
6,278,726 B1 * 8/2001 Mesecher et al. ........... 375/148

* cited by examiner

*Primary Examiner*—Manuel L Barbee
(74) *Attorney, Agent, or Firm*—Courtney Staniford & Gregory LLP (57) ABSTRACT

Signal processing systems and methods are described that include a multi-analog receiver front end with adaptive filtering. The multi-analog receiver front end uses two or more analog-to-digital converters (ADCs) to remove additive electrical noise present in the analog front end. The multiple ADCs are followed in the signal processing path by digital statistical signal processing. The multi-analog receiver front end adaptively determines the passband of a digital filter in a system with input signals having a wide frequency range of interest, and controls filtering of the input signals to the narrow frequency range that includes an input signal. The multi-analog receiver front end, through removal of additive noise, provides higher signal-to-noise ratios for a given power dissipation and chip area when compared to receiver front ends which do not use the multiple ADCs.

14 Claims, 6 Drawing Sheets

| N | Amp 2X(nT) [Mpp] | Freq 2X(nT) [Hz] | f [Hz] | SNR X_sum(n) [dB] | SNR Estimated 2X(nT) [dB] |
|---|---|---|---|---|---|
| 1024 | 1 | 3 | 512 | 36.1 | 46.6 |
| 2048 | 1 | 3 | 512 | 36.2 | 48.9 |

REMOVING ELECTRICAL NOISE IN SYSTEMS WITH ADCS

TECHNICAL FIELD

The disclosure herein relates generally to signal processing. In particular, this disclosure relates to systems and methods for increasing the signal-to-noise ratio (SNR) in systems that include analog-to-digital converters (ADCs).

BACKGROUND

Analog-to-digital converters (ADCs) are used in many state of the art applications in order to convert a signal from the analog domain to the digital domain. The signal-to-noise-ratio (SNR) achieved by the ADC generally determines the signal-to-noise-ratio of the host electronic system that includes the ADC. Therefore ADCs are crucial components of electronic systems.

The signal-to-noise-ratio of conventional ADCs has been improved through the use of increasing power consumption of the ADC and increasing the size of critical transistors included in the ADC. However, the increased chip size which results from increases in the power consumption and increases in the size of ADC transistors results in increased cost of the ADC chips. State of the art systems generally also include a digital filter that follows the ADC in the signal path of the host electronic system. The digital filter limits the bandwidth of the system output to the frequency range in which interesting input signals can occur. Consequently, there is a need for systems and methods that reduce the power consumption and the chip size of a signal processing system at a given specified signal-to-noise ratio in comparison to state of the art systems.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

In the drawings, the same reference numbers identify identical or substantially similar elements or acts. To easily identify the discussion of any particular element or act, the most significant digit or digits in a reference number refer to the Figure number in which that element is first introduced (e.g., element 102 is first introduced and discussed with respect to FIG. 1).

DETAILED DESCRIPTION

Signal processing systems and methods are described below that include a multi-analog receiver front end with adaptive filtering. The multi-analog receiver front end uses two or more analog-to-digital converters (ADCs) to remove additive electrical noise present in the analog front end. The multiple ADCs are followed in the signal processing path by digital statistical signal processing. The multi-analog receiver front end adaptively determines the passband of a digital filter in a system with input signals having a wide frequency range of interest, and controls filtering of the input signals to the narrow frequency range that includes an input signal. The multi-analog receiver front end, through removal of additive noise, provides higher signal-to-noise ratios for a given power dissipation and chip area when compared to receiver front ends which do not use the multiple ADCs.

The multi-analog receiver front end of an embodiment decreases the noise inherent to the analog front ends at an output of the system that includes an ADC. The multi-analog receiver front end described below adaptively determines the passband of a digital filter in a system with input signals having a wide frequency range of interest, and controls filtering of the input signals to the narrow frequency range that includes an input signal. The filter attenuates and therefore reduces the noise in other frequency ranges or bands outside the narrow pass band.

The multi-analog receiver front end distinguishes between noise and wanted input signal using dual ADCs in an embodiment, and makes use of a cross-correlation function. The cross-correlation is a measure of similarity of two signals, commonly used to find features in an unknown signal by comparing the unknown signal to a known signal. The cross-correlation is a function of the relative time between the signals. The cross-correlation function is used to determine the highly correlated input signal of the ADCs and to eliminate non-correlated noise added by the two ADCs. The receiver front end in an embodiment uses information of the output of the cross-correlation function to adaptively adjust the passband of a digital filter in real-time, thus matching the frequency range of the analog input signal of the ADC, and to filter the sum of the outputs of the two ADCs.

The use of dual ADCs divides the chip area and the power consumption that would be necessary for one ADC into two portions. In contrast to a single ADC, two ADCs running in parallel provide reduced noise with no penalty in chip area or power consumption. The two ADCs of an embodiment receive the same input signal. The output of each of the two ADCs includes the converted input signal, which is a common signal in both channels. The two ADC outputs are highly correlated with respect to the input signal. The noise which is inherent in each of the two ADCs will also be present at the outputs of the two ADCs, and the noise in the two ADC outputs is not correlated.

In the following description, numerous specific details are introduced to provide a thorough understanding of, and enabling description for, embodiments of the multi-analog receiver front end with adaptive filtering. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments of the multi-analog receiver front end with adaptive filtering.

Figure 1:
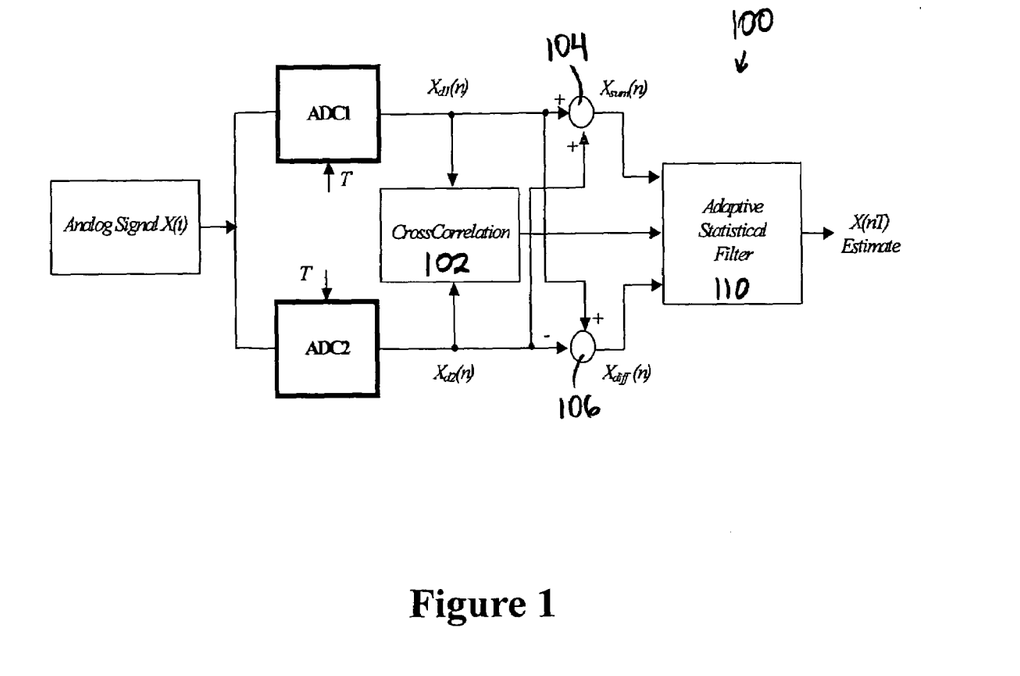
FIG. 1 is a block diagram of a multi-analog receiver front end system with adaptive filtering, under an embodiment.

FIG. 1 is a block diagram of a multi-analog receiver front end system 100 with adaptive filtering, under an embodiment. The front end system 100 includes two ADCs ADC1, ADC2 configured to receive an input analog signal X(t). While two ADCs are shown in this embodiment, alternative embodiments can include more than two ADCs. A digital output signal $X_{d1}(n)$ of the first ADC ADC1 is coupled to a cross-correlation device 102 as well as a summing device 104 and a differencing device 106. The term "device" as used herein includes a circuit, logic, and or a combination of circuitry and logic, but is not so limited. A digital output signal $X_{d2}(n)$ of the second ADC ADC2 is also coupled to each of the cross-correlation device 102, summing device 104, and differencing device 106.

The front end system 100 includes an adaptive filter 110, for example an adaptive statistical filter, that is coupled to outputs of each of the cross-correlation device 102, summing device 104, and differencing device 106. The adaptive filter 110 generates a signal estimate X(nT) from information of a sum of digital output signals $X_{d1}(n)$ and $X_{d2}(n)$ ($X_{sum}(n)$), a difference of digital output signals $X_{d1}(n)$ and $X_{d2}(n)$ ($X_{diff}(n)$), and cross-correlation of digital output signals $X_{d1}(n)$ and $X_{d2}(n)$, and outputs a signal estimate X(nT). The output of the summing device 104 is represented herein as $X_{sum}(n)$, while the output of the differencing device 106 is represented herein as $X_{diff}(n)$.

The input analog signal X(t) is converted through the two ADCs ADC1, ADC2 to the digital signals $X_{d1}(n)$ and $X_{d2}(n)$, respectively. The noise introduced by each ADC is modelled as additive noise as follows:

$$X_{d1}(n)=X(\text{nT})+N_1(n);$$

$$X_{d2}(n)=X(\text{nT})+N_2(n).$$

The variable T represents the sampling time of the ADCs ADC1, ADC2. The variables $N_1(n)$ and $N_2(n)$ are uncorrelated random variables, both of which are uncorrelated with respect to front end system output estimate X(nT). The system output X(nT) is the digital signal which results from sampling and quantizing input analog signal X(t).

The assumption is made in the description herein that $N_1(n)$ and $N_2(n)$ only include noise generated by the circuits of the ADCs ADC1, ADC2. Such noise is accurately modelled as an additive, zero mean random process. The zero mean assumption is used with no loss of generality in order to simplify the discussion. The analysis herein applies to any $N_1(n)$ and $N_2(n)$, regardless of statistical distribution, as long as $N_1(n)$ and $N_2(n)$ are uncorrelated.

The multi-analog receiver front end system 100 efficiently removes the additive noise from X(nT) by using two different digital signal processing mechanisms. A first signal processing mechanism is cross-correlation of $X_{d1}(n)$ and $X_{d2}(n)$ to estimate the autocorrelation function of system output signal X(nT). The cross-correlation device 102 performs the cross-correlation but the system is not so limited. A second signal processing mechanisms applies an adaptive statistical filter to an output $X_{sum}(n)=X_{d1}(n)+X_{d2}(n)$ of the summing device 104.

Most statistical filters require a priori knowledge of the statistics of the input signal and the noise, or an efficient method of estimating those statistics in real-time. The multi-analog receiver front end system 100 overcomes this difficulty using one or more of following estimates or calculations. As a first estimate, the statistics of the input signal X(t) are estimated by computing the cross-correlation of $X_{d1}(n)$ and $X_{d2}(n)$. Because $N_1(n)$ and $N_2(n)$ are uncorrelated, it follows that $$R_{Xd1Xd2}(k)=E[X_{d1}(n)X_{d2}(n+k)]=E[X(nT)X(nT+kT)]$$
$$=R_{xx}(k).$$

Furthermore, as a second estimate, the front end system 100 estimates statistics of $N_1(n)+N_2(n)$ from $$X_{diff}(n)=X_{d1}(n)-X_{d2}(n)=N_1(n)-N_2(n).$$

As $N_1(n)$ and $N_2(n)$ are uncorrelated, zero mean processes, the most meaningful statistics of the sum of $N_1(n)$ and $N_2(n)$ ($N_1(n)+N_2(n)$) are identical to the statistics of the difference of $N_1(n)$ and $N_2(n)$ ($N_1(n)-N_2(n)$). If the noise processes are not zero mean, there will be a constant shift in those statistics, which can accurately be estimated.

A third method used by multi-analog receiver front end system 100 to overcome the lack of a priori knowledge of input signal statistics is to calculate the coefficients of the digital filter that processes the sum $X_{sum}(t)$ of the two ADC outputs. The calculation is based on the statistics obtained by the cross-correlation and the subtraction of the outputs $X_{d1}(n)$ and $X_{d2}(n)$ of the two ADCs ADC1, ADC2.

The derivations described above assume that X(nT) is a Wide Sense Stationary process having first and second moments that do not vary with time, which might not be the case in practice. Therefore the multi-analog receiver front end system 100 updates the filter coefficients of the adaptive statistical filter 110 so the coefficients match the statistics of the input signal X(t) to the filter. There are two practical implications of this method. First, there can be a delay of at least NT between X(t) and the system output X(nT). A second implication is that the statistical filter should be fast enough to produce a seamless sequence of estimated X(nT).

Figure 2:
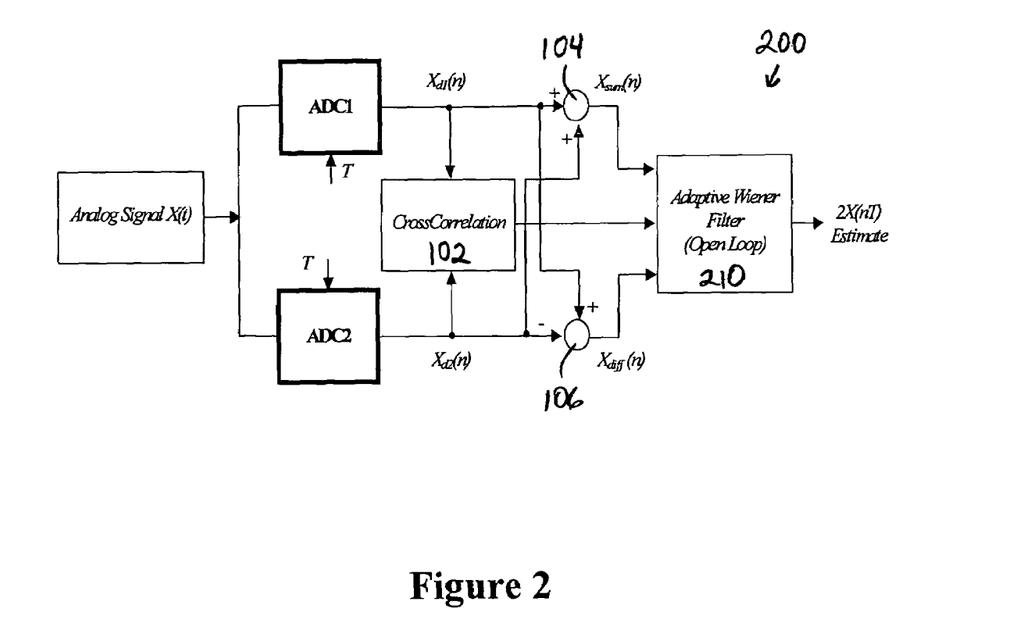
FIG. 2 is a block diagram of a multi-analog receiver front end system configured to remove additive white Gaussian noise (AWGN), under an embodiment.

A more specific example of the multi-analog receiver front end system is configured to provide higher SNR of input signals by removing additive white Gaussian noise (AWGN). Gaussian noise is noise that has a probability density function of the normal distribution (Gaussian distribution). FIG. 2 is a block diagram of a multi-analog receiver front end system 200 configured to remove additive white Gaussian noise (AWGN), under an embodiment. The front end system 200 includes two ADCs ADC1, ADC2 configured to receive an input analog signal X(t). A digital output signal $X_{d1}(n)$ of the first ADC ADC1 is coupled to a cross-correlation device 102 as well as a summing device 104 and a differencing device 106. An output digital signal $X_{d2}(n)$ of the second ADC ADC2 is also coupled to each of the cross-correlation device 102, summing device 104, and differencing device 106.

The front end system 200 includes an adaptive linear Wiener filter 210 that is coupled to outputs of each of the cross-correlation device 102, summing device 104, and differencing device 106. The Wiener filter 210 generates a signal estimate 2X(nT) from information of a sum of digital output signals $X_{d1}(n)$ and $X_{d2}(n)$ ($X_{sum}(n)$), a difference of digital output signals $X_{d1}(n)$ and $X_{d2}(n)$ ($X_{diff}(n)$), and cross-correlation of digital output signals $X_{d1}(n)$ and $X_{d2}(n)$, and outputs the signal estimate 2X(nT). The output of the summing device 104 is represented herein as $X_{sum}(n)$, while the output of the differencing device 106 is represented herein as $X_{diff}(n)$.

The Wiener filter is considered to provide the best linear estimate in the Mean Square Error (MSE) sense of a signal. Wiener filters however have generally been considered as being of limited use in many practical applications because they require a priori knowledge of the autocorrelation function of the signal they seek to estimate. Thus the Wiener filter has been used mostly as a benchmark to test other noise removal algorithms.

The multi-analog receiver front end described herein allows for use of the Weiner filter in receiver front ends however because the front end of an embodiment solves the problem of the estimation of the autocorrelation function of X(nT) by including a device that performs a cross-correlation of digital signals $X_{d1}(n)$ and $X_{d2}(n)$. In the case of AWGN, the Wiener filter used to estimate a sequence of length N of 2X(nT), $2X^N(nT)$, when the input is a sequence of length N of $X_{sum}(n)$, $X_{sum}^N(n)$, is, $$W = R_{2x2x}(R_{2x2x} + \sigma^2 I)^{-1},$$

Estimated $2X^N(nT) = W.X_{sum}^N(n)$, where $$R_{2X2X} = E[2X^N(nT).2X^N(nT)^T],$$

where $\sigma^2$ represents the variance of the quantity ($N_1(n)+N_2(n)$), and the variable I represents the identity matrix.

Further development of the expression of $R_{2X2X}$ provides, $$E[2X^N(nT).2X^N(nT)^T] = 4E[X^N(nT)X^N(nT)^T] = 4R_{xx},$$

where $E[X^N(nT)X^N(nT)^T]$ is the autocorrelation matrix of the sequence of X(nT) of length N. The estimation of $R_{xx}$ is described above and provides $$R_{Xd1Xd2}(k) = E[X_{d1}(n).X_{d2}(n+k)] = E[X(nT).X(nT+kT)]$$
$$= R_{xx}(k).$$

The autocorrelation matrix $R_{xx}$ is then estimated by building a Toeplitz matrix of dimension N×N out of the vector $[R_{Xd1Xd2}(0), \ldots, R_{Xd1Xd2}(N-1)]$. The variance of ($N_1(n)+N_2(n)$) is identical to the variance of $X_{diff}(n) = N_1(n) - N_2(n)$, therefore the variance of $N_1(n)+N_2(n)$ can be estimated from the variance of $X_{diff}(n)$. The estimated system output is approximately, $$X(nT) = \frac{1}{2}.W.X_{sum}^N(n).$$

The Wiener Filter generates or computes its matrix W every N samples. The matrix W once generated is applied to filter the same samples X(nT) which were used to compute the matrix W. The latter procedure is referred to as open loop adaptation.

The multi-analog receiver front end system of an embodiment has been tested using a model of the multi-analog receiver front end system built into Simulink® software. Simulink® is a block library tool for modelling, simulating, and analyzing non-linear dynamic systems; Simulink® is available from The Math Works, Inc. of Natick, Mass. An AWGN was added to the input analog signal. The dual ADCs were simulated via the cascade of a zero-order hold and a 16-bit uniform quantizer. The SNR was measured in the frequency domain using a Hann-windowed Fast Fourier Transform (FFT) in a band of 64 Hz. The input signal, sampling frequency and noise band were chosen to be representative of the type of sensors that can be found in the automotive industry. Similar results were obtained with other input frequencies. The examples shown use N=1024 and 2048, respectively, to make an efficient use of the FFT algorithm, but the simulation is not so limited.

Figure 3:
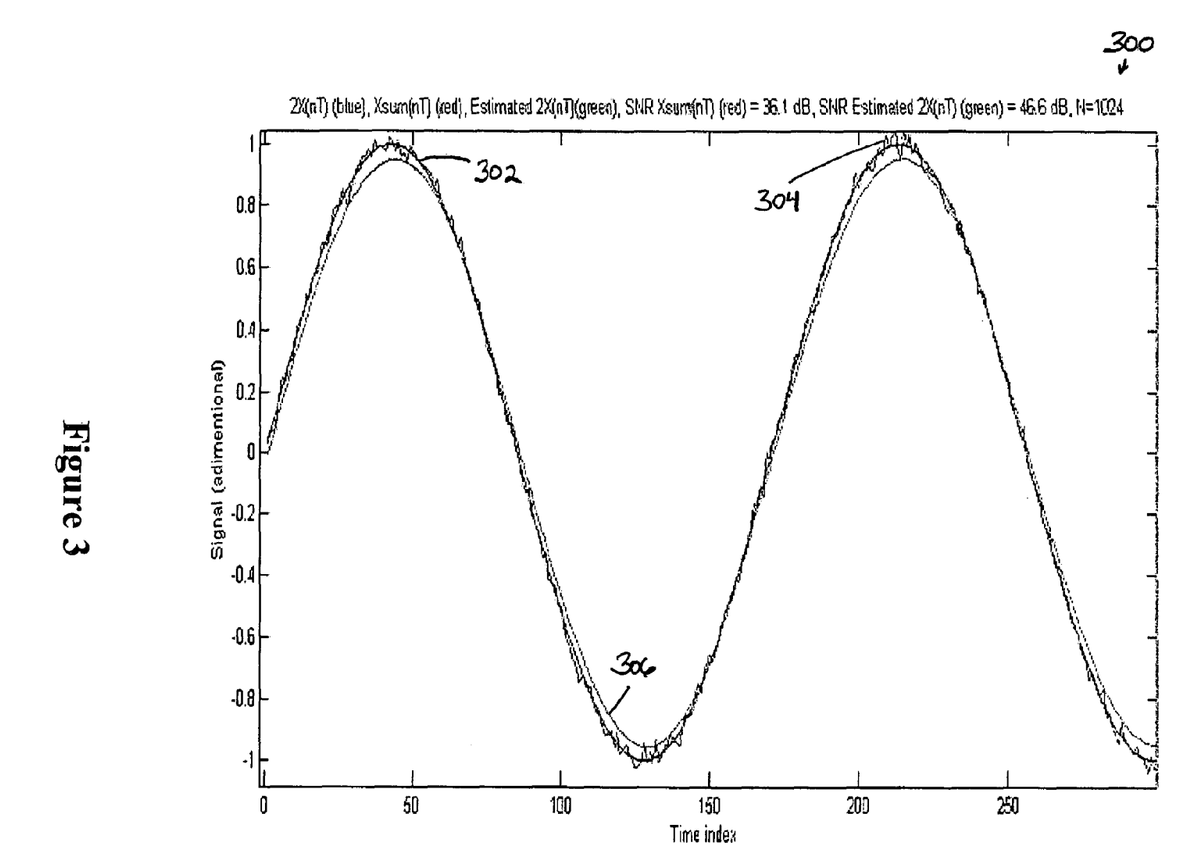
FIG. 3 is a plot of the results obtained for simulation of a multi-analog receiver front end system configured to remove AWGN, using an input analog signal having a frequency of 3 Hz, a sampling frequency (fs) of 512 Hz, and a window size (N) equal to 1024, under an embodiment.

FIG. 3 is a plot of the results 300 obtained for simulation of a multi-analog receiver front end system configured to remove AWGN, under an embodiment. The simulation is based on an input analog signal having a frequency of 3 Hz, a sampling frequency (fs) of 512 Hz, and a window size (N) equal to 1024. The traces shown on the results 300 include the following: 2X(nT) trace 302, $X_{sum}(nT)$ trace 304, estimated 2X(nT) trace 306. These results 300 show a SNR of $X_{sum}(nT)$ 304 to be approximately equal to 36.1 dB, and a SNR of the estimated 2X(nT) 306 to be approximately equal to 46.6.

Figure 4:
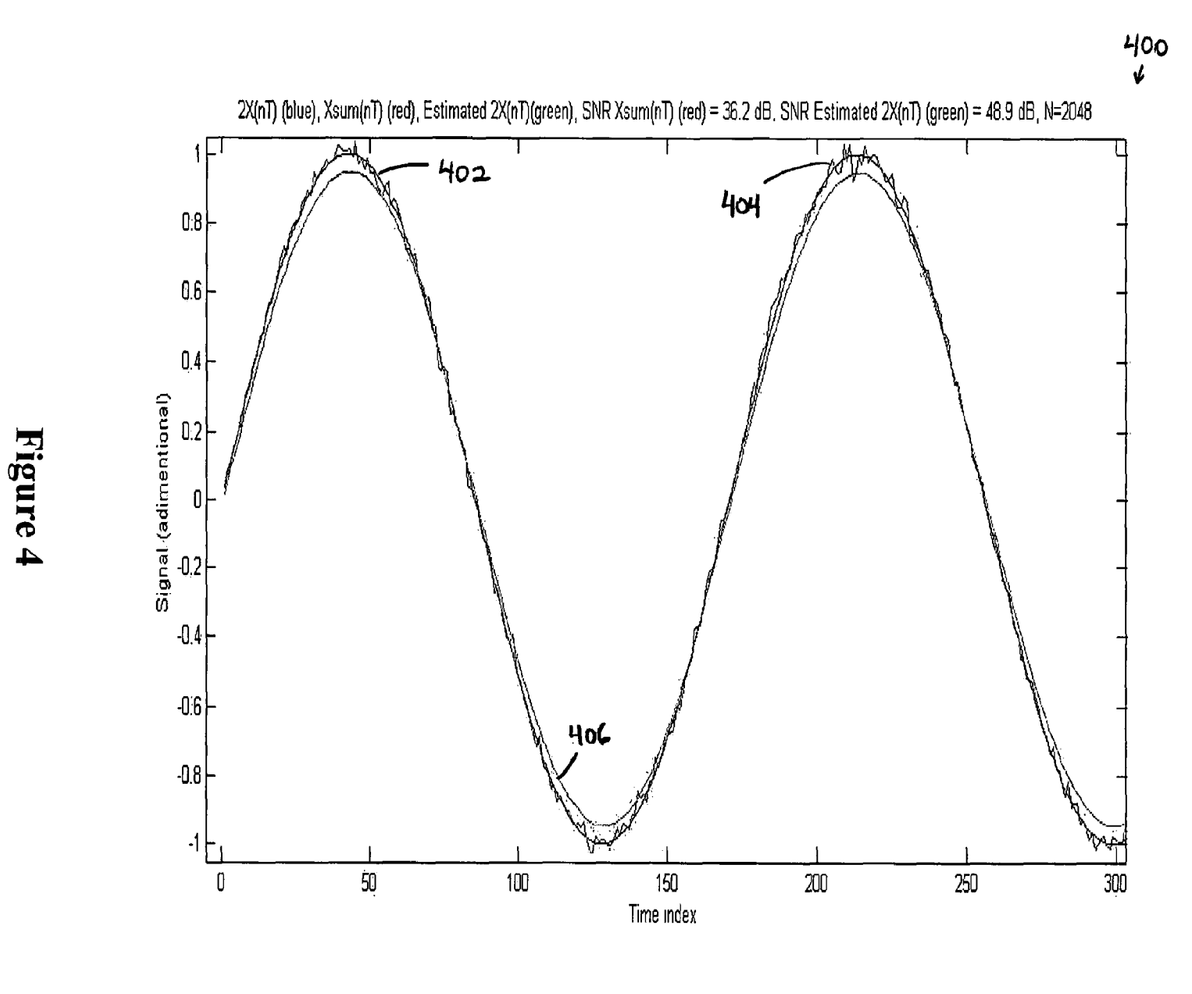
FIG. 4 is a plot of the results obtained for simulation of a multi-analog receiver front end system configured to remove AWGN, using an input analog signal having a frequency of 3 Hz, a sampling frequency (fs) of 512 Hz, and a window size (N) equal to 2048, under an embodiment.

FIG. 4 is a plot of the results 400 obtained for simulation of a multi-analog receiver front end system configured to remove AWGN, under an embodiment. The simulation is based on an input analog signal having a frequency of 3 Hz, a sampling frequency (fs) of 512 Hz, and a window size (N) equal to 2048. The traces shown on the results 400 include the following: 2X(nT) trace 402, $X_{sum}(nT)$ trace 404, estimated 2X(nT) trace 406. These results 400 show a SNR of $X_{sum}(nT)$ 404 to be approximately equal to 36.2 dB, and a SNR of the estimated 2X(nT) 406 to be approximately equal to 48.9.

Figure 5:
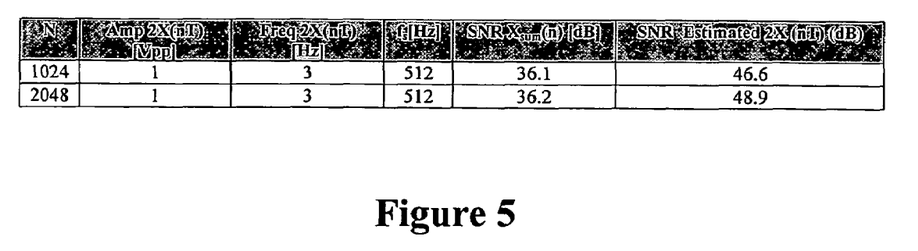
FIG. 5 shows a table summarizing results of simulations of a multi-analog receiver front end system configured to remove AWGN, under an embodiment.

FIG. 5 shows a table summarizing results 300 and 400 of simulations of a multi-analog receiver front end system configured to remove AWGN, under an embodiment. The results 300 and 400 are plotted above in FIGS. 3 and 4.

Figure 6:
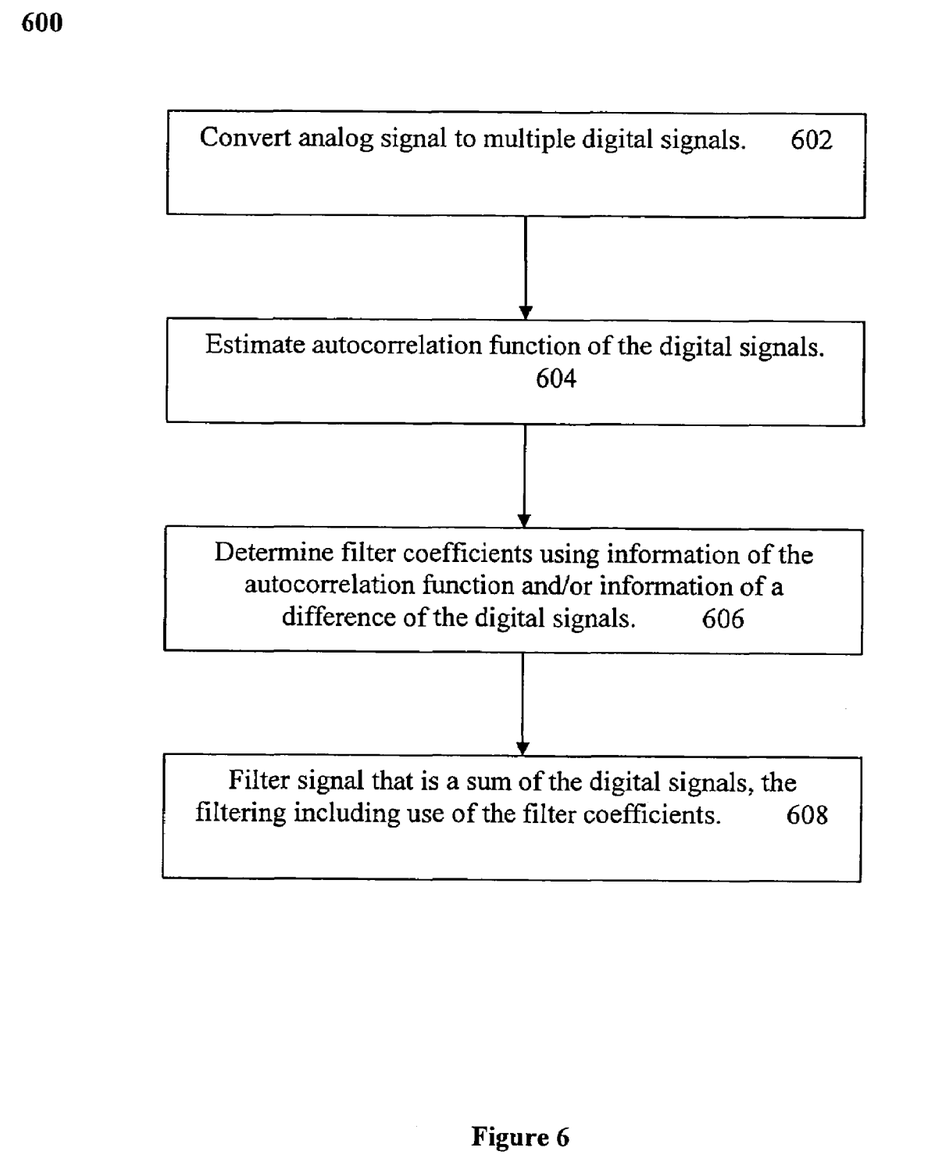
FIG. 6 is a flow diagram for processing signals to increase the signal to noise ratio, under an embodiment.

FIG. 6 is a flow diagram for processing 600 signals to increase the signal to noise ratio, under an embodiment. An analog input signal is converted 602 to two or more digital signals. Each digital signal represents the analog signal. An autocorrelation function is estimated 604 for digital signals. Filter coefficients are determined 606 using information of the autocorrelation function and/or difference information of the digital signals. A signal that is a sum of the digital signals is generated and filtered 608 using the filter coefficients and the filtered signal is provided as an output signal. Electrical noise of the output signal is reduced relative to that of the input signal.

As described above, the multi-analog receiver front end system achieves significantly higher Signal to Noise Ratios (SNRs) for a given power dissipation and chip area than a standard ADC if each of the multiple ADCs is implemented such that it uses half the chip area and dissipates half the power of the reference ADCs. The die area and power consumption of the digital circuitry that implements the statistical adaptive filter is thus expected to be much lower than the power dissipation of each of the ADCs.

Aspects of the multi-analog receiver front end system described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the multi-analog receiver front end system include: microcontrollers with memory (such as electronically erasable programmable read only memory (EEPROM)), embedded microprocessors, firmware, software, etc. Furthermore, aspects of the multi-analog receiver front end system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The functions described herein can be performed by programs or sets of program codes, including software, firmware, executable code or instructions running on or otherwise being executed by one or more general-purpose computers or processor-based systems. The computers or other processor-based systems may include one or more central processing units for executing program code, volatile memory, such as RAM for temporarily storing data and data structures during program execution, non-volatile memory, such as a hard disc drive or optical drive, for storing programs and data, including databases and other data stores, and a network interface for accessing an intranet and/or the Internet. However, the functions described herein may also be implemented using special purpose computers, wireless computers, state machines, and/or hardwired electronic circuits.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs including, without limitation, net-list generation programs, place and route programs and the like.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the multi-analog receiver front end system is not intended to be exhaustive or to limit the multi-analog receiver front end system to the precise form disclosed. While specific embodiments of, and examples for, the multi-analog receiver front end system are described herein for illustrative purposes, various equivalent modifications are possible within the scope of the multi-analog receiver front end system, as those skilled in the relevant art will recognize. The teachings of the multi-analog receiver front end system provided herein can be applied to other systems and methods, not only for the multi-analog receiver front end system described above.

The elements and acts of the various embodiments described above can be combined to provide further embodiments. These and other changes can be made to the multi-analog receiver front end system in light of the above detailed description.

In general, in the following claims, the terms used should not be construed to limit the multi-analog receiver front end system to the specific embodiments disclosed in the specification and the claims, but should be construed to include all systems and methods that operate under the claims. Accordingly, the multi-analog receiver front end system is not limited by the disclosure, but instead the scope of the multi-analog receiver front end system is to be determined entirely by the claims.

While certain aspects of the multi-analog receiver front end system are presented below in certain claim forms, the inventors contemplate the various aspects of the multi-analog receiver front end system in any number of claim forms. For example, while only one aspect of the system may be recited as embodied in machine-readable medium, other aspects may likewise be embodied in machine-readable medium. Accordingly, the inventors reserve the right to add additional claims after filing the application to pursue such additional claim forms for other aspects of the multi-analog receiver front end system.

What is claimed is:

1. A system comprising:
   a plurality of analog-to-digital converters (ADCs) configured to each receive an input analog signal and to output a digital signal;
   a cross-correlator coupled to the output of each of the plurality of ADCs;
   an adaptive filter coupled to an output of the cross-correlator, wherein information of the cross-correlator controls a passband of the adaptive filter; and
   a summing device including inputs coupled to the plurality of ADCs and a summing device output coupled to the adaptive filter, wherein the summing device is configured to provide at the summing device output a first signal by adding the digital signals output from the plurality of ADCs.

2. The system of claim 1, wherein the adaptive filter is configured to filter the first signal and provide the filtered signal as an output, wherein electrical noise of the output is reduced relative to the input analog signal.

3. The system of claim 1, further comprising a differencing device coupled to the plurality of ADCs and the adaptive filter, wherein the differencing device is configured to generate a second signal that is a difference of the digital signals output from the plurality of ADCs.

4. The system of claim 3, wherein the adaptive filter includes a plurality of coefficients, wherein the coefficients are determined using information of one or more of a cross-correlator operation and the second signal.

5. The system of claim 1, wherein the cross-correlator applies a cross-correlation function to the digital signals output from the plurality of ADCs.

6. The system of claim 1, wherein the cross-correlator estimates statistics of the input analog signal.

7. A method for controlling a filter for processing signals, comprising:
   converting an analog signal to a plurality of digital signals;

cross-correlating the plurality of digital signals;
adding the plurality of digital signals to form a first signal; and
adaptively controlling a filter passband with information of the cross-correlating, wherein the first signal is filtered using the filter passband to output a filtered signal, wherein electrical noise of the filtered signal is reduced.

8. The method of claim 7, wherein each digital signal represents the analog signal.

9. The method of claim 7, further comprising estimating an autocorrelation function of the plurality of digital signals using information of the cross-correlating.

10. The method of claim 7, wherein adaptively controlling the filter passband comprises determining filter coefficients.

11. The method of claim 10, further comprising determining filter coefficients using one or more of information of an autocorrelation function estimated from the cross-correlating and information of a difference signal resulting from differencing the plurality of digital signals.

12. The method of claim 7, wherein adaptively controlling the filter passband includes use of information of a difference signal resulting from differencing the plurality of digital signals.

13. The method of claim 7, wherein the cross-correlating estimates statistics of the analog signal.

14. A method for controlling a filter for processing signals, comprising:
converting an analog signal to a plurality of digital signals, wherein each digital signal represents the analog signal;
estimating an autocorrelation function of the plurality of digital signals;
adding the plurality of digital signals to form a first signal;
determining filter coefficients using one or more of information of the autocorrelation function and difference information of the plurality of digital signals; and
adaptively controlling a filter passband using the filter coefficients during filtering of the first signal.

* * * * *